United States Patent [19]

Lukes et al.

[11] 4,274,056
[45] Jun. 16, 1981

[54] CHARGE AMPLIFIER WITH MINIMUM OFFSET VOLTAGE

[75] Inventors: Henry J. Lukes, Bellevue; Walter Kamphorst, Redmond; Romeal F. Asmar, Bellevue, all of Wash.

[73] Assignee: Sundstrand Data Control, Inc., Redmond, Wash.

[21] Appl. No.: 958,685

[22] Filed: Nov. 8, 1978

[51] Int. Cl.³ .................... H03F 3/70; H03F 3/72; H03F 1/08
[52] U.S. Cl. .................................... 328/162; 328/127; 328/165; 330/9
[58] Field of Search ............... 328/127, 165, 162; 330/9

[56] References Cited

U.S. PATENT DOCUMENTS

| | | | |
|---|---|---|---|
| 2,970,266 | 1/1961 | Molloy et al. | 330/9 |
| 3,469,197 | 9/1969 | Ryan | 328/165 X |
| 3,502,983 | 3/1970 | Ingle et al. | 328/162 X |
| 3,654,560 | 4/1972 | Cath et al. | 328/162 X |
| 3,801,919 | 4/1974 | Wilkes et al. | 330/9 |
| 4,068,165 | 1/1978 | Labinsky et al. | 328/162 X |
| 4,119,918 | 10/1978 | Moser | 328/165 |

Primary Examiner—John S. Heyman
Attorney, Agent, or Firm—Wegner, Stellman, McCord, Wiles & Wood

[57] ABSTRACT

A charge amplifier having minimum offset voltage such as for use in processing a signal from a capacitive transducer. The amplifier is arranged to minimize the offset voltage and drift. The amplifier is arranged to be reset to zero upon application of supply voltage thereto, and the resetting circuit is arranged to reset the amplifier automatically during an adjustable interval after application of the supply voltage. The charge amplifier is further compensated for temperature variation and is arranged at minimum offset voltage notwithstanding strong background noise. The amplifier is arranged to have a drift of no more than a fraction of a millivolt per second. The amplifier circuit includes an improved switching arrangement and may utilize a second amplifier circuit for effecting temperature compensation.

18 Claims, 4 Drawing Figures

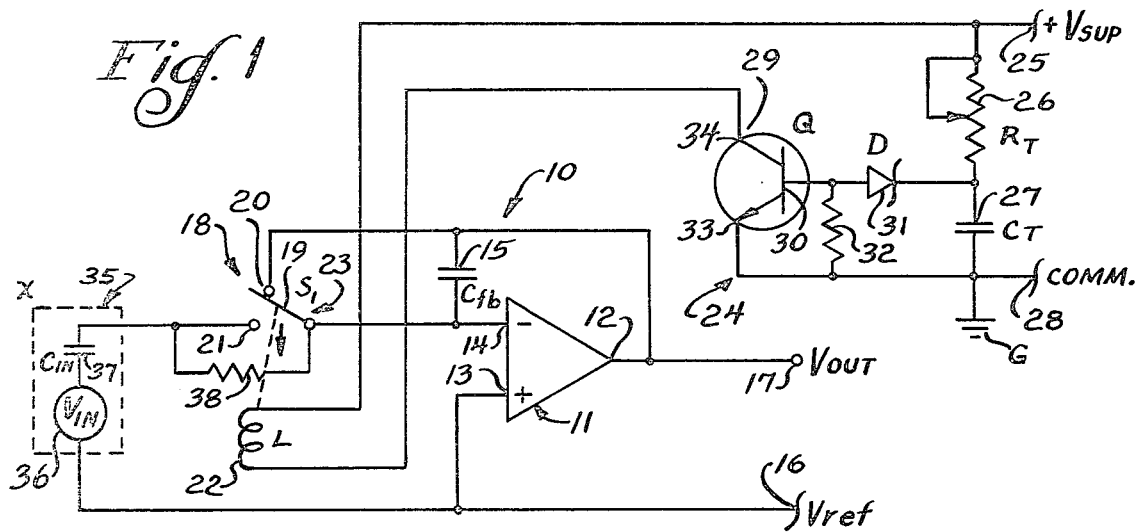
Fig. 1
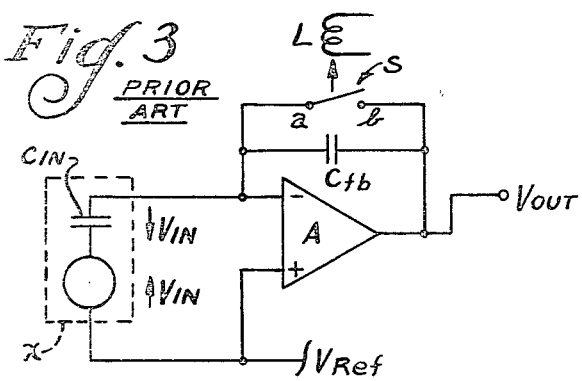
Fig. 3 PRIOR ART
Fig. 2
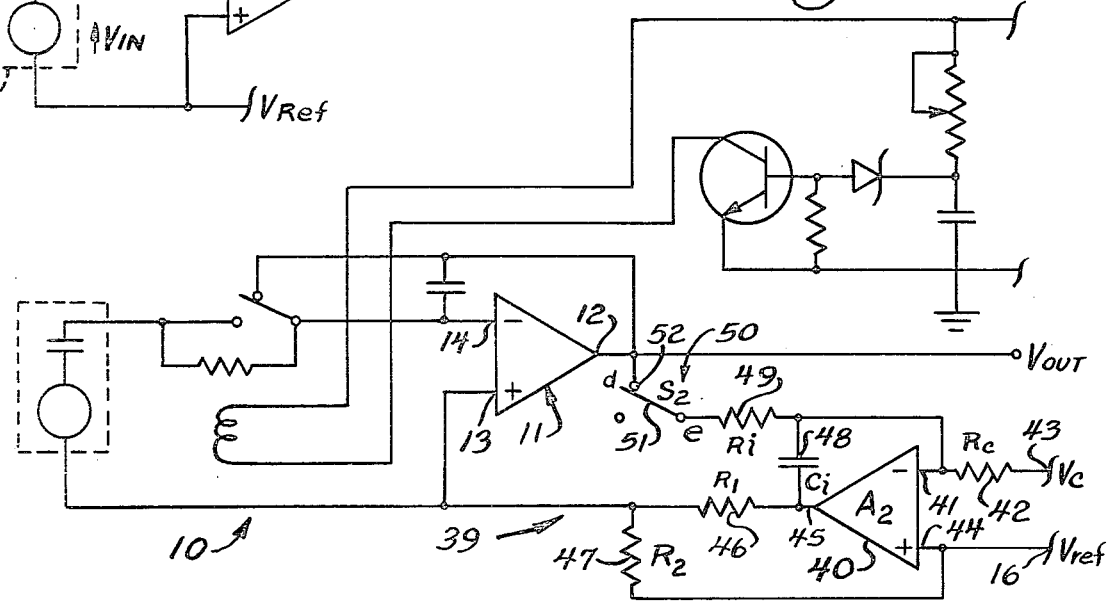
Fig. 4

CHARGE AMPLIFIER WITH MINIMUM OFFSET VOLTAGE

BACKGROUND OF THE INVENTION

1. Field of the Invention

This invention relates to charge amplifiers and in particular to charge amplifiers for use in providing an output signal from a capacitive transducer input.

2. Description of the Prior Art

In one known signal processing system, a charge amplifier is utilized as the first stage for providing a signal to subsequent stages from a capacitive acceleration transducer. The subsequent stages utilize the signal from the charge amplifier, and by means of an integrator, measure velocity and displacement of the moving object under test.

It is important that the charge amplifier in such a system have a very small DC offset voltage as such offset voltages are integrated over relatively long periods of time and may cause a substantial error in the output signal. The drift of the offset voltage should also be minimized.

Another problem in such signal processing systems is that the charge amplifier is caused to operate only during a limited time interval, and its operation should commence at a preselected time after application of supply voltage to the system. A time delay is desirable to permit resetting the amplifier to zero so as to assure removal of stray charges which may have accumulated on the feedback capacitor of the charge amplifier prior to the desired operation.

The input transducer is exposed to random vibrations such as during the resetting interval and, thus, it is desirable to initiate operation of the amplifier only at the desired initiation of input signal transmission.

Another problem encountered in the use of such charge amplifier signal processing systems is the difficulty of maintaining minimum offset voltages over a wide temperature rage as may often be encountered.

As the output signal is effectively a DC voltage signal, the charge amplifier must have good DC response and, thus, decay of the DC component of the signal during the operating interval is desirably minimized.

Another problem encountered in such signal processing systems is the fact that appreciable noise is often present, presenting a serious problem of minimizing the offset voltage.

Where the system is utilized with a capacitive acceleration transducer, acceleration shocks which may occur during the "Off" condition of the amplifier, may produce relatively high transient voltages which must be prevented from being impressed on the amplifier at such time.

SUMMARY OF THE INVENTION

The present invention comprehends an improved charge amplifier for use with a capacitive acceleration transducer or the like which provides minimum offset voltage and effectively minimizes voltage drift.

The charge amplifier is provided herein in an improved circuit which solves the problems discussed above in an extremely simple and economical manner.

More specifically, the invention comprehends providing in a charge amplifier circuit having a charge amplifier, a transducer connected to a source of reference voltage, and a feedback capacitor connected between an inverting input terminal and output terminal of the amplifier, improved resetting means including a double-throw, break-before-make switch whose contacts are arranged in such a way that they are normally connected across said capacitor, and disconnect said transducer from said inverting input terminal, and control means for selectively operating said switch to firstly disconnect the switch from across the capacitor and thus effect said connection of the transducer to the inverting input terminal whereby said capacitor is charge-free at the time the switch connects the transducer to said inverting input terminal.

The invention further comprehends providing, in such a charge amplifier circuit, compensating means for reducing offset voltage at the output of the amplifier resulting from imperfect balancing of the amplifier components and thermal variations.

The amplifier circuit is arranged to be reset automatically during an adjustable short interval after application of the supply voltage thereto.

The circuit is arranged to effect minimum offset voltage notwithstanding the presence of substantial noise signals.

The resetting means of the amplifier circuit provides a high resistance in the "Off" condition of the amplifier so as to have minimum effect on the amplifier DC response.

The DC offset voltage of the amplifier is caused to remain substantially at zero notwithstanding wide temperature variations. Drift of the offset voltage is effectively minimized over a wide range of temperatures.

The amplifier circuit effectively prevents subjecting the amplifier to shock voltages resulting from shock acceleration signals produced in the input transducer.

The charge amplifier circuit of the present invention is extremely simple and economical of construction while yet providing the highly desirable improved functioning discussed above.

BRIEF DESCRIPTION OF THE DRAWING

Other features and advantages of the invention will be apparent from the following description taken in connection with the accompanying drawing wherein:

FIG. 1 is a schematic wiring diagram of a charge amplifier circuit embodying the invention;

FIG. 2 is a schematic wiring diagram of a modified form of charge amplifier circuit embodying the invention;

FIG. 3 is a schematic wiring diagram of a prior art amplifier circuit presenting the problems solved by the present invention; and FIG. 4 is a waveform diagram illustrating operating conditions of the prior art charge amplifier circuit of FIG. 3.

DESCRIPTION OF THE PREFERRED EMBODIMENTS

In the exemplary embodiments of the invention as disclosed in FIGS. 1 and 2 of the drawing, a charge amplifier circuit generally designated 10 is shown to include a conventional DC charge amplifier 11 having an output terminal 12, a noninverting input terminal 13, and an inverting input terminal 14. A feedback capacitor 15 is connected between terminals 12 and 14 in the conventional manner. Input terminal 13 is connected to a conventional voltage reference source 16 and terminal 12 is connected to an output terminal 17 for feeding the amplified signal to the next stage of the signal processing chain. As the present invention is concerned with the charge amplifier circuit 10, the specific associated circuitry in the signal processing system is not shown as not being pertinent to the understanding of the present invention.

As indicated briefly above, it is necessary to reset the charge amplifier 11 before the initiation of the operating cycle. Such resetting is conventionally effected by a shorting switch arranged to provide a shorted connection between terminals 12 and 14 in parallel with capacitor 15. Such a prior art charge amplifier control circuit is sown in FIG. 3.

As illustrated in FIG. 3, resetting of charge amplifiers has been effected in the prior art by means of a suitable shorting switch S (FIG. 3), such as electromechanical relays, and whose contacts a,b are connected in parallel with a feedback capacitor $C_{Fb}$ across the charge amplifier.

The resetting function is correct only as long as it is done in absence of an input voltage but would result in an undesirable offset if the resetting happens when the input transducer X has some voltage. Here $V_{in}$ means the internal voltage of the transducer which is shown in FIG. 3, by its equivalent circuit, as a voltage source $V_{in}$ in series with the internal capacitance $C_{in}$ of the transducer. Since the amplifier works in the inverting mode, the whole internal voltage $V_{in}$ is used to generate a voltage drop—$V_{in}$ of opposite polarity on $C_{in}$ which in turn results in a current through $C_{in}$ and $C_{Fb}$, so an output voltage $V_{out}$ appears across $C_{Fb}$. This voltage, in case of a correct function, has a similar but inverted and amplified waveform as $V_{in}$, as shown by curve $V'_{out}$ in FIG. 4.

However, in case that the resetting was done during time T (FIG. 4), the feedback capacitor $C_{Fb}$ was shorted during this time, so both the output and inverting input terminal were held on the reference voltage $V_{ref}$, which, for example, can be zero. When, at instant 2, the resetting short was removed, $C_{Fb}$ started with zero charge and continued with waveform $V_{out}$ which was the same as $V'_{out}$ except that this waveform was shifted by an offset voltage $V_{of}$ which, in the worst case, could be as high as the amplified peak value of the input voltage $V_{in}$. This output voltage represents actually the amplified sum of the internal input signal voltage $V_{in}$ and of the offset voltage which was stored in capacitor $C_{in}$ at the instant 2 when the resetting short was removed.

This offset could be avoided only if the resetting interval ended exactly in the instant when the input waveform goes through zero; however, since this waveform is a random noise with unpredictable zero crossings, it is practically impossible to synchronize the resetting function in this way. Moreover, it is impossible to sense the zero crossing since the voltage source $V_{in}$ is not accessible.

In the illustrated embodiment of the present invention as shown in FIG. 1, the problem presented by the prior art control discussed above is eliminated in a novel and simple manner. More specifically, an electromechanical relay generally designated 18 is provided in circuit 10 which relay includes a moving contact 19 which selectively engages a first fixed contact 20 or a second fixed contact 21. The moving contact is connected to inverting input terminal 14 of the amplifier 11 and fixed contact 20 is connected to output terminal 12. The other fixed contact 21 is connected to the transducer 35. The moving contact 19 is normally disposed, as shown in FIG. 1, in engagement with fixed contact 20 so as to short out capacitor 15 in the nonoperating mode of the amplifier.

Relay 18 further includes an operating coil 22 which, when energized, transfers moving contact 19 into engagement with fixed contact 21. Thus, as seen in FIG. 1, the relay contacts effectively define a bread-before-make double-throw switch generally designated 23. A suitable delay is generated in circuit 10 and by means of relay 18 to cause impressing of the transducer signal on the amplifier after the application of the supply voltage to the relay coil 22.

As will be obvious to those skilled in the art, the use of relay 18 is exemplary, as other switching devices, such as a solid state-type MOSFET electronic switch may be utilized as desired.

To energize selectively the relay coil 22, a control circuit 24 may be utilized. Thus, as shown in FIG. 1, the supply voltage input 25 may be connected through a series connection of a variable resistor 26 and a capacitor 27 to the common supply line 28. One end of the relay coil 22 is connected to the supply line 25.

A transistor 29 has its base 30 connected through a Zener diode 31 to between resistor 26 and capacitor 27. A resistor 32 is connected from base 30 to common lead 28, which, as shown in FIG. 1, may be connected to ground G. The emitter 33 of transistor 29 may be connected to common line 28 and the collector 34 thereof may be connected to the other side of the relay coil 22, as shown in FIG. 1.

Thus, circuit 24 effectively defines a gate controlling an RC timing network formed by resistor 26 and capacitor 27. Thus, when voltage is impressed between lines 25 and 28, current flows through resistor 26 and capacitor 27 to charge the capacitor. At this time, effectively no current is delivered to base 30 of the transistor 29, so that the transistor remains nonconducting, thereby preventing energization of relay coil 22. When the charge on capacitor 27 reaches the Zener voltage of diode 31, the diode initiates conduction of current to the transistor base to turn on the transistor and thereby energize the relay coil so as to transfer moving contacts 19 of the relay from fixed contact 20 to fixed contact 21, as discussed above.

Adjustment of resistor 26 permits a variable time delay before energization of relay coil 22. Upon turning on of the transistor 29, as discussed above, the transistor remains on so as to maintain energization of coil 22 until disconnection of the supply voltage to line 25. Thus, the charge amplifier 11 is maintained in operating mode as long as the supply voltage is maintained on line 25.

As indicated briefly above, it is necessary to provide means for preventing an undesirable offset voltage in the output of amplifier 11, such as may occur as a result of a voltage being applied to the input terminal 14. In the illustrated embodiment, a transducer 35, which illustratively comprises a capacitive acceleration transducer, defines an equivalent circuit consisting of a voltage source 36 in series with the internal capacitance 37 of the transducer. As shown in FIG. 1, the transducer is connected between reference voltage line 16 and fixed contact 21 of switch 23. Charge amplifier 11 functions in an inverting mode and, thus, the internal voltage of the transducer generates a voltage drop of opposite polarity on its internal capacitance 37 and causes current flow through the feedback capacitor 15, thereby producing an amplified output voltage on the output terminal 12.

The use of the double-throw, break-before-make switch 23 effectively assures the voltage at the output terminal 12 to be zero at the start of the function. Thus, the improved switch means 23 effectively avoids the impressing of an offset voltage on the output. More specifically, switch 23 effectively disconnects the transducer 35 from the input terminal 14 during the resetting of the amplifier so that no current flows to the amplifier from the transducer at this time. Therefore, no charge is stored in the feedback capacitor 15, and as a result, the amplified output waveform $V_{out}$ may jump to the correct position at the instant moving contact 19 closes with fixed contact 21. Thus, no undesirable offset voltage is produced in the output of the amplifier.

As a static voltage may be accumulated on the disconnected transducer 35 as a result of the open condition of switch 23, as discussed above, it is desirable to dissipate such static voltage, and for this purpose, a high ohmic value resistor 38 is connected between fixed contact 21 and moving contact 19, as shown in FIG. 1. In the illustrated embodiment, the resistor 38 may have a value of approximately $10^9$ to $10^{10}$ ohms and, thus, effectively discharges any voltage from the transducer to the output, which is at zero voltage before the start of the function. As will be obvious to those skilled in the art, such static voltage may be similarly discharged through a resistance connected by a suitable switch across the transducer. However, the use of resistor 38, as discussed above, eliminates the need for additional switching means and, thus, provides a facilitated low cost static voltage dissipation means.

Thus, circuit 10 provides an improved charge amplifier operation with minimum offset voltage. The presence of noise in the circuit is effectively prevented from generating any offset voltage on the output terminal 17 and, thus, an improved amplification of the desired input signal is provided in the signal processing chain.

Referring now to the embodiment of FIG. 2, a compensating circuit generally designated 39 may be utilized with the circuit 10 to provide minimization of offset voltage caused by temperature changes. More specifically, while circuit 10 effectively prevents generation of offset voltages on the output as a result of noise in the system, imperfect balance of the amplifier components may produce offset voltages as is commonly encountered in such high gain amplifiers. Such offset voltages are readily adjusted to zero by conventional means, such as resistor networks or trimming potentiometers, in a conventional manner as normally recommended by the manufacturers of the amplifiers. A problem arises, however, in such correction in that the adjustment is correct only at a particular temperature. The present invention comprehends an improved compensating circuit 39 which automatically compensates for such temperature variations to effectively minimize temperature drift in the amplifier 11.

More specifically, as shown in FIG. 2, the compensating circuit includes a second, or auxiliary, amplifier 40 having its inverting terminal 41 connected through a resistor 49 via switch $S_2$ to the output terminal of amplifier 11. An optional resistor 42 may be provided as one means of compensating the drift. A noninverting terminal 44 of the amplifier 40 is connected to the reference voltage line 16. The output terminal 45 of the amplifier is connected through a resistor 46 to the noninverting input terminal 13 of the amplifier 11, and a second resistor 47 is connected from terminal 13 to terminal 44 of the auxiliary amplifier 40.

The feedback capacitor 48 is connected between inverting terminal 41 and output terminal 45 of amplifier 40. A resistor 49 is connected from terminal 41 to the output terminal 12 of amplifier 11 through a normally closed switch generally designated 50, having a moving contact 51 connected to resistor 49 and a fixed contact 52 connected to amplifier terminal 12.

Auxiliary circuit 39 effectively defines an integrator circuit with the integrating network defined by resistor 49 and capacitor 48 being connected to the output of the main amplifier 11 selectively through the switch 50. This integrating network effectively integrates the voltage at the output of the main amplifier 11 during the resetting interval and applies a portion of the integrated voltage through the divider network defined by resistors 46 and 47 to the noninverting terminal 13 of the main amplifier. This feedback of voltage is continued during the resetting interval. Upon termination of the resetting interval, switch 50 opens to discontinue further integration of the output voltage while maintaining the previously integrated voltage on the capacitor 48 to provide for correction of offset during the active function of amplifier 11. Thus, the integrator circuit 39 effectively corrects for additional offset voltage, whether positive or negative, which may appear at the output terminal 12 of the main amplifier as a result of temperature changes in the operation of the system.

In the illustrated embodiment, the time constant of resistor 49 and capacitor 48 is preselected so as to cause the integrated voltage during the resetting interval to be a number of times greater than that required for effecting the desired correction of the offset voltage. In the illustrated embodiment, the time constant is preselected to cause this voltage to be approximately five times greater that that required for the desired correction. However, the divider network of resistor 46 and resistor 47 causes the signal provided to the input terminal 13 of the amplifier 11 to be one-fifth of that of the integrated voltage so that a correct signal is provided for compensating the amplifier 11.

While the use of feedback correcting integrators is known, the integrating circuit 39 provides a substantial improvement in the disconnection of the integrating circuit after the end of the resetting period, thus avoiding disturbing the functioning of the charge amplifier during its active interval.

As will be obvious to those skilled in the art, the switch 50 may comprise a second pole of a double-pole, double-throw relay switch so as to be controlled by the relay coil 22 concurrently with the control thereby of switch 18.

Each of the amplifiers 11 and 40 may comprise amplifiers having MOFSET input stages utilizing relatively low input current which may be in the order of fractions of a picoamp. Nevertheless some problem may arise in effectively minimizing drift in the high gain amplifier circuit. Thus, for example, a 0.1 pA current will result in a drift of 1 mV per second on a 100 pF feedback capacitor 15 so as to present a problem in connection with the desired provision of the low offset voltage amplification. One possible solution to this problem would be to supply this current by means of a high ohmic value resistor connected from the inverting input 14 of the amplifier 11 from a suitable DC voltage. Such a resistor would require a value of approximately $10^{14}$ ohms where the DC voltage supply is a 10-volt supply. Such resistors are not only expensive, but present serious problems in maintained accurate value because of the humidity and aging.

The use of resistor 42 avoids the need for such a high accuracy resistor. As seen in FIG. 2, a portion of the current flowing through the resistor 42 from the DC voltage supply 43 provides the necessary input current to the amplifier 40. This current is integrated by capacitor 48 and provides a drift on the output terminal 45, a portion of which is supplied to the noninverting input terminal 13 of the main amplifier 11. In the illustrated embodiment, capacitor 48 has a capacitance several orders of magnitude larger than the feedback capacitor 15 and, thus, a much higher current is required to cause a drift in the output voltage at terminal 45. Additionally, the drift must be faster than necessary for amplifier 11 as only a portion of the integrated voltage is impressed on terminal 13 as a result of the divider network 46,47. Thus, the value of resistor 42 need only be in the order of $10^{10}$ ohms, permitting the use of a more conventional low-cost resistor.

Thus, the improved amplifier circuit 10 provides a low drift amplified signal through the means of a double-throw, break-before-make control switch the first set of contacts of which are alternatively normally connected across the feedback capacitor of the main amplifier while disconnecting the transducer terminal, and upon throwing of the switch effect a subsequent connection of the transducer to the inverting input terminal of the main amplifier. The second set of switch contacts connects the input of the integrator 40 to the output during the resetting interval. The resetting circuit defines means for selectively operating the switch to effect such break-before-make operation to cause the feedback capacitor to be effectively charge-free at the time the switch connects the transducer to the inverting input terminal. The invention further provides an improved minimized offset voltage through the use of compensating means for reducing the offset voltage at the output of the main amplifier resulting from imperfect balance thereof and thermal variations.

In one improved charge amplifier circuit embodying the invention, the quiescent offset voltage of the main amplifier varied only several millivolts over a temperature range of more than 100° C. This minimum offset voltage was effectively maintained notwithstanding the presence of a strong background noise during the resetting operation. The drift of the charge amplifier was a small fraction of a millivolt per second. Thus, the charge amplifier exhibited highly desirable minimum offset voltage characteristics while yet being extremely simple and economical of construction, as discussed above.

The foregoing disclosure of specific embodiments is illustrative of the broad inventive concepts comprehended by the invention.

We claim:

1. In a charge amplifier circuit including a charge amplifier, a transducer connected to a source of reference voltage, and a feedback capacitor connected between an inverting input terminal and output terminal of the amplifier, the improvement comprising:

double-throw break-before-make switch means alternatively (a) connected across said capacitor shorting the capacitor and concurrently disconnecting said transducer from said inverting input terminal, and (b) connecting said transducer to said inverting input terminal and concurrently discontinuing shorting of the capacitor; and resetting circuit means for selectively operating said switch means to first disconnect the switch means from across the capacitor and subsequently effect connection of the transducer to the inverting input terminal whereby said capacitor is charge-free at the time the switch means connects the transducer to said inverting input terminal.

2. The charge amplifier circuit of claim 1 wherein said resetting circuit means comprises time delayed gating means.

3. The charge amplifier circuit of claim 1 wherein said switch means comprises contact means of an electromechanical relay including moving contact means and said resetting circuit effects selective movement of said moving contact means.

4. In charge amplifier circuit including a charge amplifier, a transducer connected to a source of reference voltage, and a feedback capacitor connected between an inverting input terminal and output terminal of the amplifier, the improvement comprising:

a double-throw, break-before-make switch alternatively (a) normally connected across said capacitor shorting the capacitor and concurrently disconnecting said transducer from said inverting input terminal, and (b) connecting said transducer to said inverting input terminal and concurrently discontinuing shorting of the capacitor;

resetting circuit means for selectively operating said switch to first disconnect the switch from across the capacitor and subsequently effect connection of the transducer to the inverting input terminal whereby said capacitor is charge-free at the time the switch connects the transducer to said inverting input terminal; and compensating means for reducing offset voltage at the output of the amplifier resulting from imperfect balance of the amplifier components and thermal variations.

5. The charge amplifier circuit of claim 4 wherein said compensating means comprises an integrator circuit including an auxiliary amplifier coupled to the noninverting input terminal of said charge amplifier and to the output terminal thereof through a second, normally closed switch to integrate and apply at least a portion of the offset voltage at said output terminal to said noninverting terminal of the charge amplifier effectively only during the resetting interval after which said normally closed switch opens.

6. The charge amplifier circuit of claim 4 wherein said compensating means comprises an integrator circuit including an auxiliary amplifier coupled to the noninverting input terminal of said charge amplifier and to the output terminal thereof through a second, normally closed switch to integrate and apply at least a portion of the voltage at said output terminal to said noninverting terminal of the charge amplifier effectively only during the resetting interval after which said break-before-make switch is switched to connect said transducer to said inverting input terminal.

7. The charge amplifier circuit of claim 4 wherein said compensating means comprises an integrator circuit including an auxiliary amplifier coupled to the noninverting input terminal of said charge amplifier and to the output terminal thereof through a second, normally closed switch to integrate and apply a portion of the voltage at said output terminal through an RC integrating network and a divider network coupled to the auxiliary amplifier to said noninverting terminal of the charge amplifier effectively only during the resetting interval after which said normally closed switch opens.

8. The charge amplifier circuit of claim 4 wherein said compensating means comprises an integrator circuit including an auxiliary amplifier coupled to the noninverting input terminal of said charge amplifier and to the output terminal thereof through a second, normally closed switch to integrate and apply a portion of the voltage at said output terminal through an RC integrating network and a divider network coupled to the auxiliary amplifier to said noninverting terminal of the charge amplifier effectively only during the resetting interval after which said normally closed switch opens, said integrator circuit is arranged such that the voltage integrated during the resetting interval is a preselected multiple of that required to effect a desired reduction of the offset voltage and said divider network is arranged to divide the integrated voltage inversely to said multiple.

9. The charge amplifier circuit of claim 4 wherein said compensating means comprises an integrator circuit including an auxiliary amplifier coupled to the noninverting input terminal of said charge amplifier and to the output terminal thereof through a second, normally closed switch to integrate and apply at least a portion of the voltage at said output terminal to said noninverting terminal of the charge amplifier effectively only during the resetting interval after which said normally closed switch opens, said break-before-make switch and said auxiliary switch being portions of a double pole double-throw electromechanical relay.

10. The charge amplifier circuit of claim 4 wherein said compensating means comprises an integrator circuit including an auxiliary amplifier coupled to the noninverting input terminal of said charge amplifier and to the output terminal thereof through a second, normally closed switch to integrate and apply at least a portion of the voltage at said output terminal to said noninverting terminal of the charge amplifier effectively only during the resetting interval after which said normally closed switch opens, and a resistor connecting the inverting input terminal of the auxiliary amplifier to a DC potential source, said RC integrating network including a resistor coupling said normally closed switch to said inverting input terminal of the auxiliary amplifier, and an integrating capacitor connected between said inverting input terminal and the output terminal of the auxiliary amplifier.

11. The charge amplifier circuit of claim 4 wherein said compensating means comprises an integrator circuit including an auxiliary amplifier coupled to the noninverting input terminal of said charge amplifier and to the output terminal thereof through a second, normally closed switch to integrate and apply at least a portion of the voltage at said output terminal to said noninverting terminal of the charge amplifier effectively only during the resetting interval during which said normally closed switch opens, and a resistor connecting the inverting input terminal of the auxiliary amplifier to a DC potential source, said RC integrating network including a resistor coupling said normally closed switch to said inverting input terminal of the auxiliary amplifier, and an integrating capacitor connected between said inverting input terminal and the output terminal of the auxiliary amplifier, said integrating capacitor having a capacity at least several orders of magnitude greater than that of said feedback capacitor.

12. The charge amplifier circuit of claim 4 wherein said compensating means comprises an integrator circuit including an auxiliary amplifier coupled to the noninverting input terminal of said charge amplifier and to the output terminal thereof through a second, normally closed switch to integrate and apply at least a portion of the voltage at said output terminal to said noninverting terminal of the charge amplifier effectively only during the resetting interval during which said normally closed switch opens, and a resistor connecting the inverting input terminal of the auxiliary amplifier to a DC potential source, said RC integrating network including a resistor coupling said normally closed switch to said inverting input terminal of the auxiliary amplifier, and an integrating capacitor connected between said inverting input terminal and the output terminal of the auxiliary amplifier, said integrating capacitor having a capacity at least several orders of magnitude greater than that of said feedback capacitor.

13. The charge amplifier circuit of claim 4 wherein said compensating means comprises an integrator circuit including an auxiliary amplifier coupled to the noninverting input terminal of said charge amplifier and to the output terminal thereof through a second, normally closed switch to integrate and apply a portion of the voltage at said output terminal through an RC integrating network and a divider network coupled to the auxiliary amplifier to said noninverting terminal of the charge amplifier effectively only during the resetting interval after which said normally closed switch opens, said integrator circuit being arranged such that the voltage integrated during the resetting interval is approximately five times that required to effect a desired reduction of the offset voltage and said divider network is arranged to provide to the charge amplifier noninverting input terminal a voltage approximately one-fifth that of the integrated voltage.

14. In a charge amplifier circuit including a charge amplifier having an output, and an inverting input, and a feedback capacitor connected between the output and the inverting input, resetting means comprising
   a double throw break-before-make switch having normally closed contacts connected across said feedback capacitor, and normally open contacts connected between a signal source and said inverting input of the charge amplifier.

15. The charge amplifier circuit of claim 14 including an auxiliary circuit which includes means for providing a predetermined time delay which is initiated by energization thereof and which upon termination energizes said switch.

16. The charge amplifier circuit of claims 14 or 15 having an output connected through normally closed contacts of a second switch to the input of an auxiliary integrating amplifier, at least a portion of the output voltage of which is fed to said noninverting input of the charge amplifier.

17. The charge amplifier circuit of claim 16 in which each switch comprises a double pole switch controlled by the same control circuit portion including said time delay means.

18. The charge amplifier circuit of claim 14 in which an additional resistor is connected from said inverting input of the integrating amplifier to a DC voltage source to compensate for drift.

* * * * *